(12) United States Patent  
Sato (10) Patent No.: US 8,481,430 B2  
(45) Date of Patent: Jul. 9, 2013

(54) METHOD OF MANUFACTURING SEMICONDUCTOR DEVICE

(75) Inventor: Ryou Sato, Yamagata (JP)

(73) Assignee: Renesas Electronics Corporation, Kanagawa (JP)

( * ) Notice: Subject to any disclaimer, the term of this patent is extended or adjusted under 35 U.S.C. 154(b) by 188 days.

(21) Appl. No.: 13/037,474

(22) Filed: Mar. 1, 2011

(65) Prior Publication Data

US 2011/0217844 A1 Sep. 8, 2011

(30) Foreign Application Priority Data

Mar. 2, 2010 (JP) ................................. 2010-044955

(51) Int. Cl.
*H01L 21/31* (2006.01)
*H01L 21/311* (2006.01)

(52) U.S. Cl.
USPC ............ 438/710; 438/706; 438/763; 438/778

(58) Field of Classification Search
None
See application file for complete search history.

(56) References Cited

U.S. PATENT DOCUMENTS

| 7,098,147 | B2 * | 8/2006 | Nansei et al. ................. 438/769 |
| 7,393,460 | B2 * | 7/2008 | Hori et al. ........................ 216/67 |
| 7,700,494 | B2 | 4/2010 | Balasubramaniam et al. |
| 2005/0019962 | A1 * | 1/2005 | Tatsumi ............................. 438/9 |
| 2006/0051947 | A1 * | 3/2006 | Lin et al. ........................ 438/597 |
| 2006/0091355 | A1 * | 5/2006 | Itano et al. .................... 252/79.1 |
| 2006/0196847 | A1 * | 9/2006 | Honda et al. .................... 216/67 |
| 2008/0132078 | A1 * | 6/2008 | Yamazaki ..................... 438/710 |

FOREIGN PATENT DOCUMENTS

| JP | 2006-245097 A | 9/2006 |
| JP | 2006-279748 A | 10/2006 |
| JP | 2008/527691 A | 7/2008 |

* cited by examiner

*Primary Examiner* — Scott B Geyer
(74) *Attorney, Agent, or Firm* — Foley & Lardner LLP

(57) ABSTRACT

The present invention provides a method of manufacturing a semiconductor device. The method includes stacking a $SiO_2$ film, a N-containing stopper film, and a resist pattern in this order on a semiconductor substrate, performing etching on the stopper film and the $SiO_2$ film with a F-containing etching gas, with the resist pattern serving as a mask to form an opening, and performing ashing on the resist pattern to remove the resist pattern, using a gas containing an oxygen gas and an inert gas under the condition that the ratio of the oxygen radical to the inert-gas radical becomes equal to or lower than 5.

8 Claims, 9 Drawing Sheets

| O*/Ar* | 2 | 4 | 5 | 6 | 8 | 11 |
|---|---|---|---|---|---|---|
| EXISTENCE OR NONEXISTENCE OF FOREIGN MATTER | NOT OBSERVED | NOT OBSERVED | NOT OBSERVED | SOME OBSERVED | OBSERVED | OBSERVED |
| FOREIGN MATTER THICKNESS L (nm) | 0 | 0 | 0 | 2 | 9 | 13 |

COMPARATIVE EXAMPLE

FIG. 9A

COMPARATIVE EXAMPLE

FIG. 9B

COMPARATIVE EXAMPLE

FIG. 9C

COMPARATIVE EXAMPLE

FIG. 9D

COMPARATIVE EXAMPLE

METHOD OF MANUFACTURING SEMICONDUCTOR DEVICE

This application is based on Japanese Patent Application No. 2010-044955, the content of which is incorporated hereinto by reference.

BACKGROUND

1. Technical Field

The present invention relates to a method of manufacturing a semiconductor device.

2. Related Art

There has been a semiconductor device manufacturing method including a process to form a via and an interconnect by forming an opening in an insulating layer formed on a substrate, and filling the opening with a metal such as copper.

By the semiconductor device manufacturing method, problems such as nonconductivity and high resistance might be caused when a metal fills the opening having foreign matter existing therein. Therefore, there is a demand for a means to prevent such problems.

Japanese Unexamined Patent Application Publication (Translation of PCT Application) No. 2008-527691 discloses a semiconductor device manufacturing method that includes a first ashing process and a second ashing process as the process for removing a photoresist. The photoresist is formed immediately above a low-permittivity substrate layer such as a SiOC material after an opening is formed in the low-permittivity substrate layer. The first ashing process is to be performed after an opening is formed in a low-permittivity substrate layer such as a SiOC material formed on a substrate. The first ashing process is a process for removing the photoresist formed immediately above the low-permittivity substrate layer. The second ashing process is to be performed after the first ashing process is performed, and is to be performed under the condition that the chamber pressure is lower than 20 mTorr.

Japanese Unexamined Patent Application Publication (Translation of PCT Application) No. 2008-527691 also discloses that, in the above described second ashing process, the density of oxygen-containing radical in a plasma environment becomes lower, and accordingly, detrimental oxidation of the dielectric substrate layer can be reduced (paragraph [0016] of Japanese Unexamined Patent Application Publication (Translation of PCT Application) No. 2008-527691). Japanese Unexamined Patent Application Publication (Translation of PCT Application) No. 2008-527691 also discloses that, through the second ashing process, the invasion of the cap layer serving as the bottom face of the opening can be minimized.

Therefore, according to the semiconductor device manufacturing method disclosed in Japanese Unexamined Patent Application Publication (Translation of PCT Application) No. 2008-527691, the second ashing process is performed for a period of time only long enough to remove the residuals after the ashing and the remaining photoresist.

SUMMARY

The inventor discovered that foreign matter was generated, in the following manner, in the opening to be filled with a metal. Referring now to FIGS. 9A through 9E, the inventor's findings are described below.

Figure 9A:
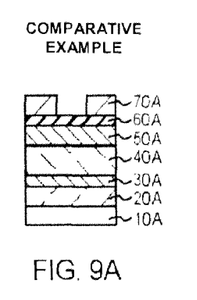
FIGS. 9A through 9E are cross-sectional views schematically showing an example of manufacturing procedures as a comparative example.
Figure 9B:
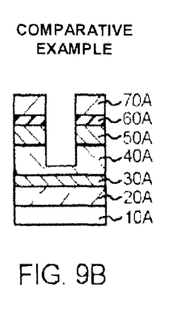

FIGS. 9A through 9E are cross-sectional views schematically showing the states of manufacturing procedures according to a semiconductor device manufacturing method using a so-called M/F (middle-first) method. First, as shown in FIG. 9A, a lower-layer interconnect 10A, a Cu plug 20A, a stopper film 30A, a SiO$_2$ film 40A, a N-containing stopper film 50A, an antireflection film 60A, and a resist pattern 70A are stacked in this order on a substrate (not shown), for example. Next, as shown in FIG. 9B, with the resist pattern 70A using as a mask, etching with a F-containing etching gas (a fluorocarbon (C$_x$F$_y$) gas or the like) is then performed on the antireflection film 60A, the N-containing stopper film 50A, and the SiO$_2$ film 40A, to form an opening. After that, the resist pattern 70A and the antireflection film 60A are removed by an ashing process using an oxygen gas, to obtain a structure shown in FIG. 9C.

Figure 9C:
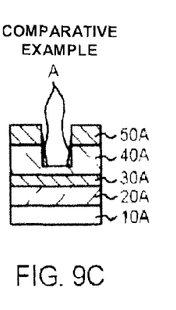
Figure 9D:
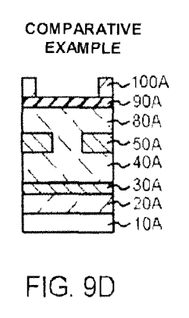

Next, as shown in FIG. 9D, After a SiO$_2$ film 80A is formed to fill the opening, an antireflection film 90A and a resist pattern 100A are stacked in this order on the SiO$_2$ film 80A.

Figure 9E:
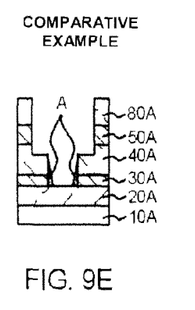

Next, with the resist pattern 100A using as a mask, etching with a F-containing etching gas (a fluorocarbon (CF) gas or the like) is then performed on the antireflection film 90A, the SiO$_2$ film 80A, the N-containing stopper film 50A, the SiO$_2$ film 40A, and the stopper film 30A. After that, the resist pattern 100A and the antireflection film 90A are removed by an ashing process using an oxygen gas, to obtain a structure having an opening as shown in FIG. 9E. After that, the opening is filled with a metal to form a via and an interconnect (not shown).

In the above described manufacturing procedures, etching with the use of a F-containing etching gas (such as a fluorocarbon (C$_x$F$_y$) gas) is performed to generate a F-containing etched product (such as a fluorocarbon polymer), and the product (not shown) is accumulated on the sidewalls or the like of the opening shown in FIG. 9B.

The oxygen radical generated during the ashing process performed to remove the resist patterns 70A and 100A does not have directionality but has a relatively high reactivity. As a result, through the ashing process, the exposed face of the N-containing stopper film 50A located under the resist patterns 70A and 100A is oxidized and becomes likely to absorb moisture. If the exposed face of the N-containing stopper film 50A absorbs the moisture in the atmosphere, the moisture reacts with the N contained in the stopper film 50A. As a result, NH$_3$ (degas) is generated and is released into the atmosphere.

In such a case, the F contained in the etched product accumulated on the sidewalls or the like of the opening reacts with the NH$_3$ in the atmosphere, and foreign matter such as NH$_4$F is generated on the sidewalls or the like of the opening, as shown in FIG. 9C. By virtue of the same mechanism as above, foreign matter A such as NH$_4$F is also generated on the sidewalls or the like of the opening in the structure shown in FIG. 9E. The same problem as above occurs in a case where a via-first method is used.

According to an aspect of the present invention, there is provided a method of manufacturing a semiconductor device, including stacking an insulating film, a N-containing stopper film, and a resist pattern in this order on a semiconductor substrate, etching the stopper film and the insulating film with a F-containing etching gas using said resist pattern as a mask, to form an opening, and performing ashing to remove the resist pattern, using a gas containing an oxygen gas and an inert gas under a condition that a ratio of the oxygen radical to the inert-gas radical becomes equal to or lower than 5, the ashing being performed after the etching.

The inventor discovered that the ion density and the ion energy were dominant with respect to the ashing rate in the ashing process of the present invention. Therefore, the ashing rate does not deteriorate, even if ashing is performed on the resist pattern under the condition that the ratio of the oxygen radical to the inert-gas radical becomes equal to or lower than 5.

The inventor also discovered that generation of foreign matter in the opening designed for forming a via and an interconnect would be restrained when ashing was performed on the resist pattern under the condition that the ratio of the oxygen radical to the inert-gas radical would become equal to or lower than 5. This is supposedly because oxidation of the exposed face of the N-containing stopper film was restrained by reducing the proportion of the oxygen radical, and as a result, generation of $NH_3$ (degas) was restrained.

According to the present invention, generation of foreign matter in the opening designed for forming a via and an interconnect can be restrained.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following is a detailed description of an embodiment of the present invention, with reference to the accompanying drawings. All the diagrams schematically show the embodiment of the present invention, and the proportions of the components shown in the drawings do not define the sizes of structures according to the present invention, unless otherwise specified.

Figure 1:
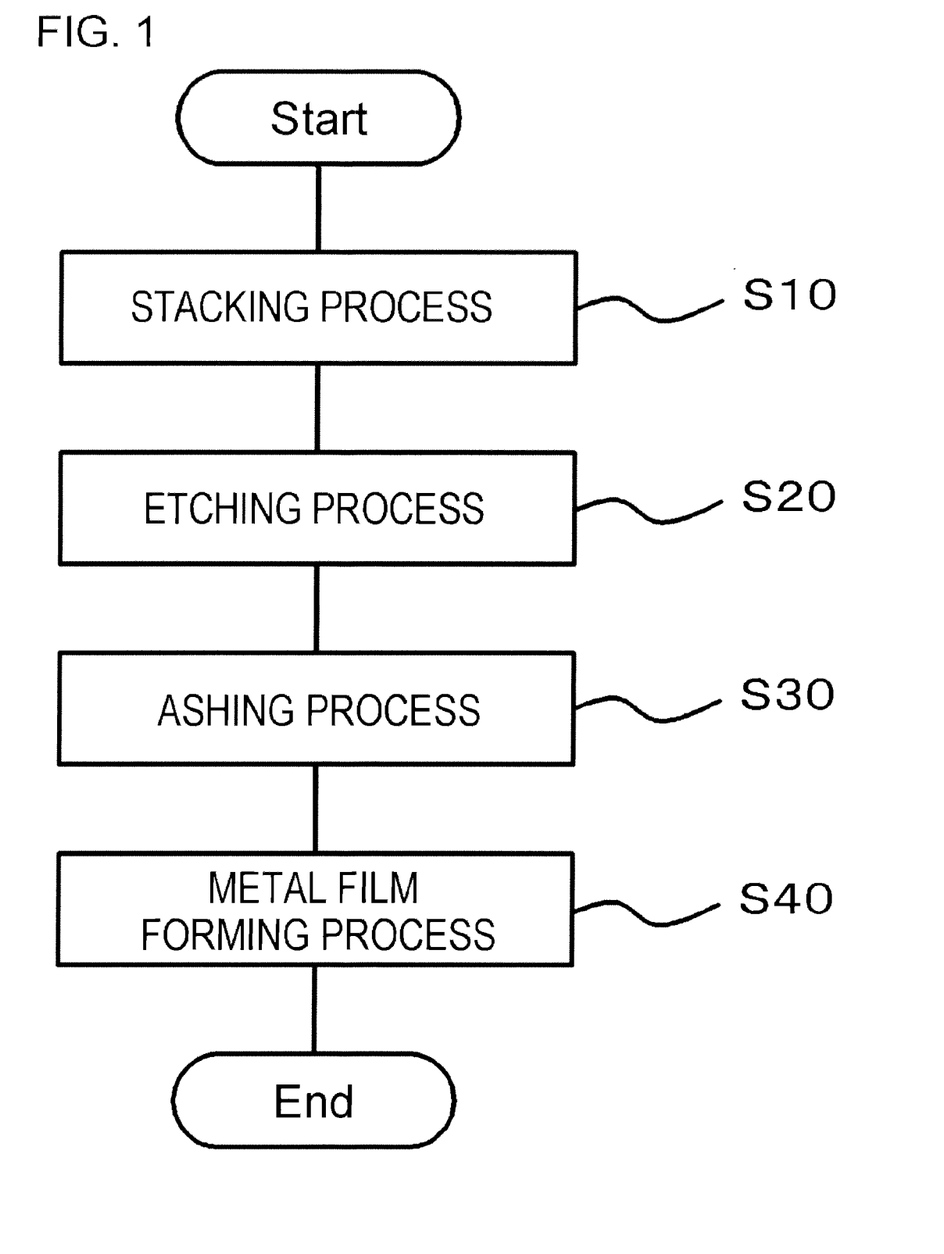
FIG. 1 is a flowchart showing an example of a method of manufacturing a semiconductor device according to this embodiment.

FIG. 1 is a flowchart showing an example of the operation flow according to a method of manufacturing a semiconductor device of this embodiment. As shown in FIG. 1, the method of manufacturing a semiconductor device of this embodiment includes a stacking process S10, an etching process S20, and an ashing process S30. The method of manufacturing a semiconductor device of this embodiment may further include a metal film forming process S40.

FIGS. 2A through 2E are cross-sectional views schematically showing the states of manufacturing procedures according to the method of manufacturing a semiconductor device of this embodiment. FIGS. 2A through 2E show an example of manufacture using a so-called MF (middle-first) method as an example of the method of manufacturing the semiconductor device of this embodiment.

In the stacking process S10, an insulating film, a N-containing stopper film, and a resist pattern are stacked in this order on a semiconductor substrate. An antireflection film may be formed between the stopper film and the resist pattern.

Figure 2A:
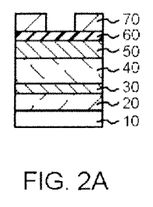
FIGS. 2A through 2E are cross-sectional views schematically showing an example of manufacturing procedures according to the method of manufacturing a semiconductor device of this embodiment.

For example, in the stacking process S10, as shown in FIG. 2A, a lower-layer interconnect 10, a Cu plug 20, a stopper film 30, a $SiO_2$ film 40, a N-containing stopper film 50, an antireflection film 60, and a resist pattern 70 are stacked in this order on a semiconductor substrate (not shown). The stopper films 30 and 50 may be formed by SiCN, for example.

In the etching process S20, the resist pattern is used as a mask, and etching is performed on the stopper film and the insulating film with a F-containing etching gas, to form an opening. In a case where an antireflection film is formed between the stopper film and the resist pattern, etching is also performed on the antireflection film.

Figure 2B:
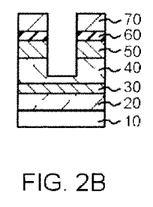

For example, in the etching process S20, as shown in FIG. 2B, the resist pattern 70 is used as a mask, and etching is performed on the antireflection film 60, the N-containing stopper film 50, and the $SiO_2$ film 40 with the use of a F-containing etching gas (a fluorocarbon ($C_xF_y$) gas or the like), to form an opening.

The ashing process S30 is performed after the etching process S20, and a gas containing an oxygen gas and an inert gas is used under the condition that the ratio of the oxygen radical to the inert-gas radical becomes equal to or lower than 5. With the use of such a gas, ashing is performed on the resist pattern and is then removed. In the case where an antireflection film is formed between the stopper film and the resist pattern, ashing is also performed on the antireflection film, and the antireflection film is removed. It should be noted that the inert gas may be a gas containing at least one of an argon gas, a helium gas, a nitrogen gas, and a hydrogen gas. In particular, the ashing process S30 is performed by the radical treatment using radicals of the oxygen gas and the inert gas. In the ashing process S30, the resist pattern is removed by the radicals excited from the oxygen gas and the inert gas under the condition of the ratio of the oxygen radical to the inert-gas radical being equal to or less than 5.

An example of a means to use a gas containing an oxygen gas and an inert gas under the condition that the ratio of the oxygen radical to the inert-gas radical becomes equal to or lower than 5 is now described.

First, the radical ratio between the oxygen radical and the inert-gas radical varies with the structure of the device (such as the arrangement of radical sources and the radical generating method), the gas pressure, the gas flow rate, the RF power, the RF power matching method, and the like. That is, the processing conditions are appropriately controlled to realize a desired radical ratio. Here, the radical ratio is defined as a ratio of the radical density. The ratio of the radical density is given by a ratio of the emission intensity of the radical in the optical emission spectroscopy analysis, such as the actinometry technique. In particular, the radical ratio of the oxygen radical to the inert-gas radical is given by [a radical density for Oxygen]/[a radical density for Inert gas] or [an emission intensity for Oxygen radical]/[an emission intensity for the radical of the inert gas].

Therefore, while at least one of the above mentioned processing conditions is being varied, the radical ratio between the oxygen radical and the inert-gas radical under the respective processing conditions is measured by optical emission spectroscopic analysis using the actinometry technique. This process is repeated to determine such a processing condition that a gas containing an oxygen gas and an inert gas can be used under the condition that the ratio of the oxygen radical to the inert-gas radical becomes equal to or lower than 5. Thereafter, ashing is performed under the determined processing condition, to perform ashing with the use of a gas containing an oxygen gas and an inert gas under the condition that the ratio of the oxygen radical to the inert-gas radical becomes equal to or lower than 5. It should be noted that the means described herein is merely an example, and the present invention is not limited to that.

After the ashing process S30 and prior to the later described metal film forming process S40, the following process may also be performed.

Figure 2C:
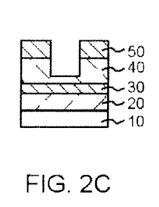
Figure 2D:
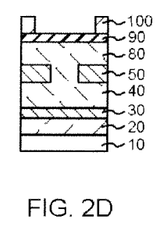

For example, after the ashing process S30, as shown in FIG. 2D, a $SiO_2$ film 80 is formed to fill the opening. An antireflection film 90 and a resist pattern 100 are then stacked in this order on the $SiO_2$ film 80. With the resist pattern 100 using as a mask, etching with a F-containing etching gas (a fluorocarbon ($C_xF_y$) gas or the like) is performed on the antireflection film 90, the $SiO_2$ film 80, the N-containing stopper film 50, the $SiO_2$ film 40, and the stopper film 30.

Figure 2E:
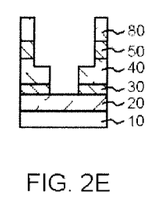

After that, the resist pattern 100 and the antireflection film 90 are removed by an ashing process using an oxygen radical, to obtain a structure having an opening as shown in FIG. 2E. The ashing process performed here may also be a process to remove the resist pattern by performing ashing with the use of a gas containing an oxygen gas and an inert gas under the condition that the ratio of the oxygen radical to the inert-gas radical becomes equal to or lower than 5.

The metal film forming process S40 is performed after the ashing process S30. After the semiconductor substrate is left in the atmosphere, a metal film is formed on the semiconductor substrate to fill the opening with a metal.

For example, a metal film (not shown) is formed on the $SiO_2$ film 80, so as to fill the opening shown in FIG. 2E with copper.

It should be noted that, although the M/F method has been described as an example in the above description, the method of manufacturing a semiconductor device of this embodiment can also be applied to a via-first method.

Next, the advantages of the method of manufacturing a semiconductor device of this embodiment are described.

First, the inventor examined the relationship between the value of the ratio of the oxygen radical to the inert-gas radical and the foreign matter generated in the opening.

Figure 3:
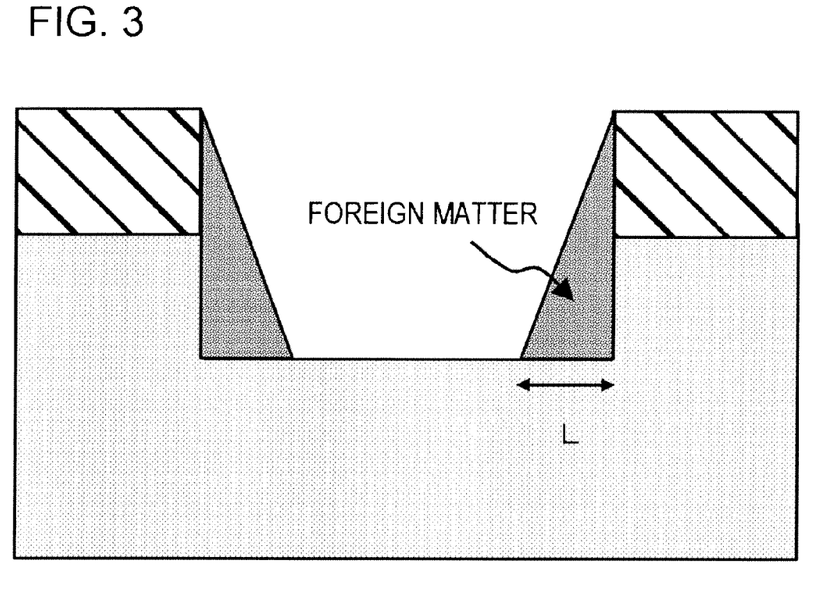
FIG. 3 is a diagram for explaining an advantage of the method of manufacturing a semiconductor device according to this embodiment.

Specifically, after the structure shown in FIG. 2C was obtained by performing the stacking process S10, the etching process S20, and the ashing process S30 in this order as described above, the obtained structure was left in the atmosphere for about 24 hours. A check is then made to determine whether foreign matter exists in the opening, and the thickness of the foreign matter was measured. An argon gas was selected as the inert gas used in the ashing process. The measured foreign matter had a thickness L in the vicinity of the bottom face of the opening, as shown in FIG. 3.

Figure 4:
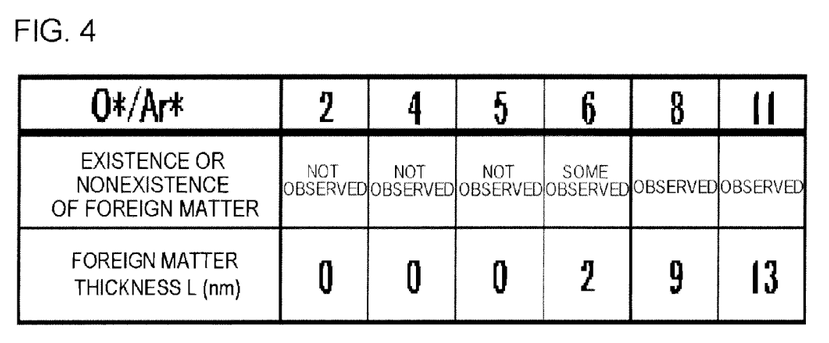
FIG. 4 is a diagram for explaining an advantage of the method of manufacturing a semiconductor device according to this embodiment.

FIG. 4 shows the results. In FIG. 4, O* represents the oxygen radical, and Ar* represents the argon radical. The same expressions as above are used in the other drawings.

As shown in FIG. 4, in a case where ashing is performed on the resist pattern with the use of such a condition that a gas containing an oxygen gas and an argon gas is used under the condition that the ratio of the oxygen radical to the argon radical becomes equal to or lower than 5, foreign matter is hardly generated in the opening. On the other hand, in a case where ashing is performed on the resist pattern with the use of such a condition that a gas containing an oxygen gas and an argon gas is used under the condition that the ratio of the oxygen radical to the argon radical becomes higher than 5, foreign matter is generated in the opening. As the proportion of the oxygen radical becomes larger, the amount of foreign matter becomes greater, as can be seen from FIG. 4. The inventor also confirmed that the same results as above were obtained in a case where one of the above mentioned inert gases other than an argon gas was used.

The results show that generation of foreign matter such as $NH_4F$ on the sidewalls of the opening can be restrained by performing ashing on the resist pattern with the use of such a condition that a gas containing an oxygen gas and an inert gas under the condition that the ratio of the oxygen radical to the inert-gas radical becomes equal to or lower than 5. This is supposedly because oxidation of the exposed face of the N-containing stopper film formed under the resist pattern was sufficiently restrained.

Figure 5:
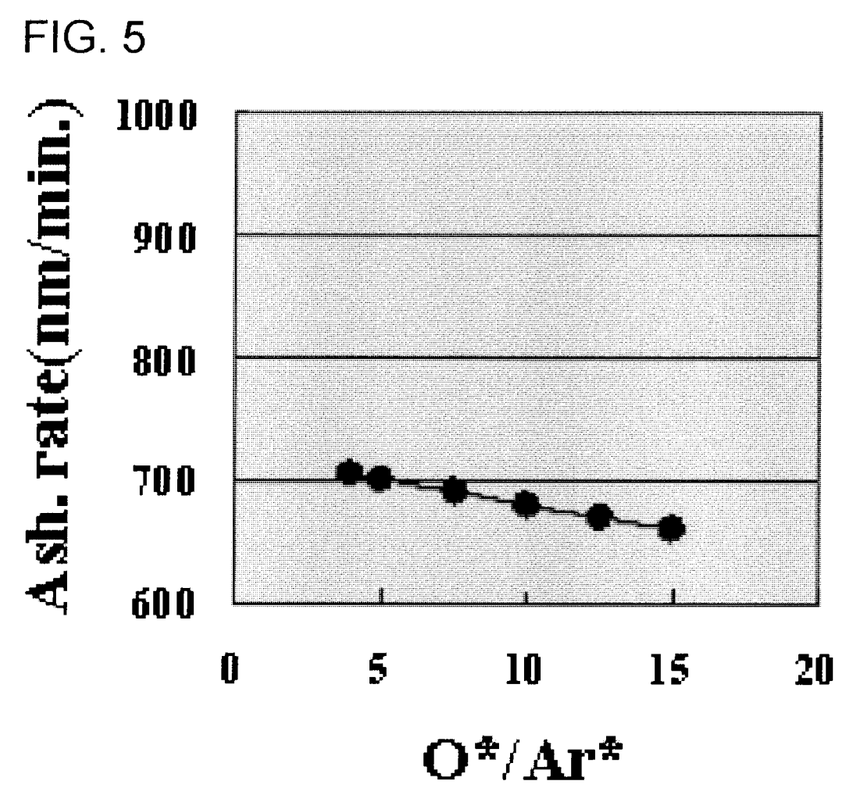
FIG. 5 is a diagram for explaining an advantage of the method of manufacturing a semiconductor device according to this embodiment.

FIG. 5 shows the relationship between the value of the ratio of the oxygen radical to the argon radical and the ashing rate. The data was obtained by the inventor actually conducting experiments and carrying out measurement. As can be seen from the graph, in the region where the value of the ratio of the oxygen radical to the argon radical varies from about 3 to 15, the ashing rate becomes higher as the value of the ratio of the oxygen radical to the argon radical becomes smaller. The inventor also confirmed that the same results as above were obtained in a case where one of the above mentioned inert gases other than an argon gas was used.

Figure 6:
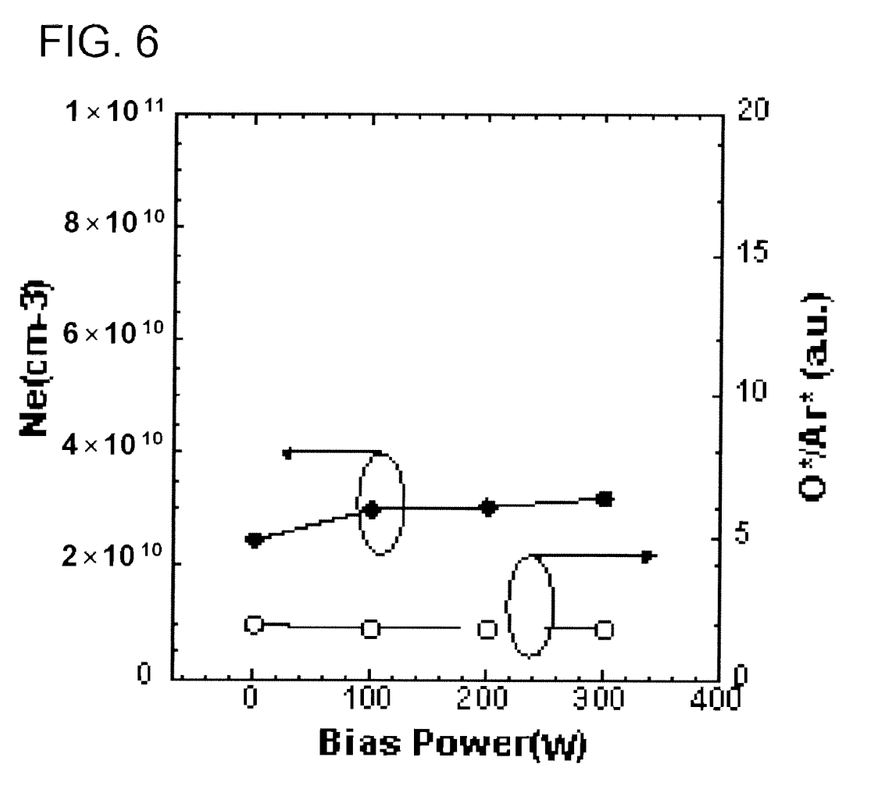
FIG. 6 is a diagram for explaining an advantage of the method of manufacturing a semiconductor device according to this embodiment.
Figure 7:
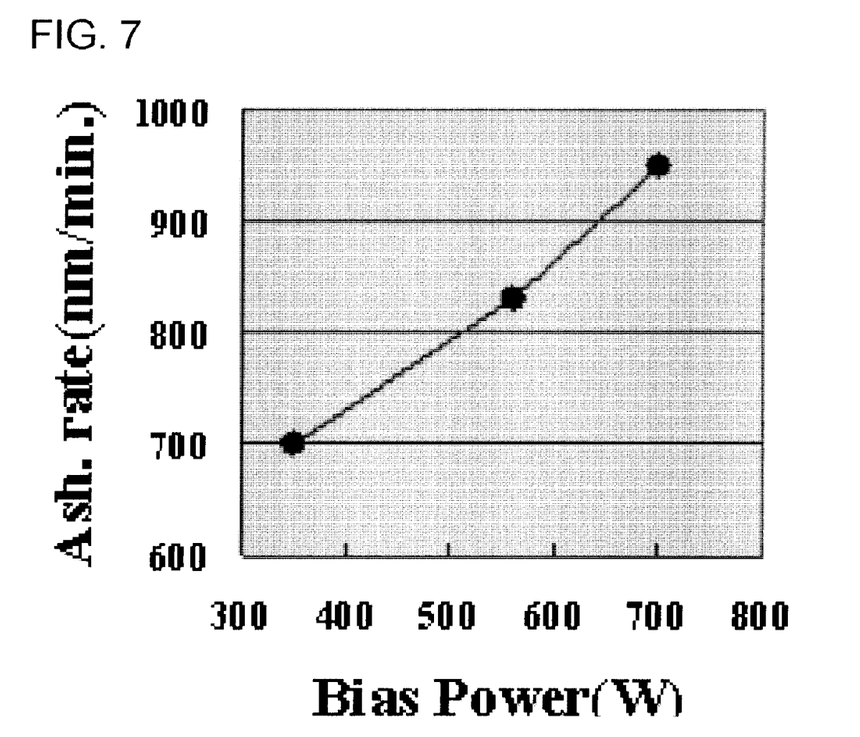
FIG. 7 is a diagram for explaining an advantage of the method of manufacturing a semiconductor device according to this embodiment.

FIG. 6 shows the relationship between the value of the ratio of the oxygen radical to the argon radical and the bias power. FIG. 7 shows the relationship between ashing rate and the bias power. The data was obtained by the inventor actually conducting experiments and carrying out measurement.

As can be seen from FIG. 6, since the electron density Ne hardly depends on the bias power, the value of the ratio of the oxygen radical to the argon radical also hardly depends on the bias power. As can be seen from FIG. 7, however, the ashing rate greatly depends on the bias power. That is, in the ashing process, it is apparent that the ion density and the ion energy are dominant with respect to the ashing rate. The inventor also confirmed that the same results as above were obtained in a case where one of the above mentioned inert gases other than an argon gas was used.

With the above facts being taken into consideration, the condition that the ratio of the oxygen radical to the argon radical becomes equal to or lower than 5 is used in the ashing process in this embodiment. Accordingly, the ashing rate is not adversely affected, and generation of foreign matter in the opening to be filled with a metal is restrained.

The inventor next examined the relationship between the amount of wafer to be inserted into a FOUP and generation of foreign matter for reference.

Figure 8A:
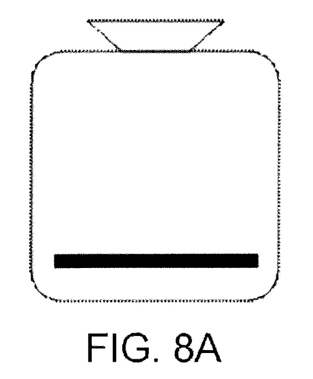
FIGS. 8A and 8B are diagrams for explaining an advantage of the method of manufacturing a semiconductor device according to this embodiment.
Figure 8B:
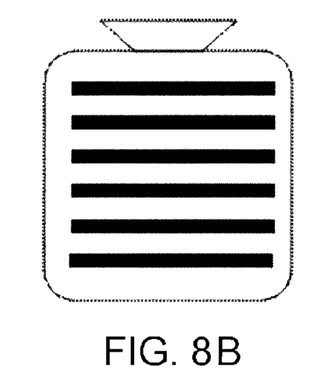

Specifically, after the stacking process S10 and the etching process S20 were performed, ashing was performed on the resist pattern by using a gas containing an oxygen gas and an inert gas under the condition that the ratio of the oxygen radical to the inert-gas radical would become higher than 5. After that, the processed wafer was held in the FOUP for a predetermined time, and generation of foreign matter was observed. It should be noted that one wafer was inserted into one FOUP (FIG. 8A), and the largest possible number of wafers were inserted into the other FOUP (FIG. 8B).

After a predetermined period of time passed, the wafers were taken out of the FOUPs, and generation of foreign matter in the openings was observed. The results showed that foreign matter was hardly generated in the wafer taken out of the FOUP shown in FIG. 8A. On the other hand, foreign matter was seen in the wafers taken out of the FOUP shown in FIG. 8B. This is supposedly because, in the case where the wafer density in a FOUP was low as in the case of FIG. 8A, the $NH_3$ (degas) generated from the wafer was diluted, and, as a result, the F contained in the etched product accumulated on the sidewalls of the opening did not react with the $NH_3$ in the atmosphere. In the case where the wafer density in a FOUP was high as in the case of FIG. 8B, the density of $NH_3$ generated from the wafers became high, and the F contained in the etched product accumulated on the sidewalls of the opening reacted with the $NH_3$ in the atmosphere. This result is considered to be the proof of the above described mechanism of foreign matter generation the inventor newly discovered.

It is apparent that the present invention is not limited to the above embodiment, and may be modified and changed without departing from the scope and spirit of the invention.

What is claimed is:

1. A method of manufacturing a semiconductor device, comprising:
    stacking an insulating film, a N-containing stopper film, and a resist pattern in this order on a semiconductor substrate;
    etching said stopper film and said insulating film with a F-containing etching gas using said resist pattern as a mask, to form an opening; and
    performing ashing to remove said resist pattern by using a gas containing an oxygen gas and an inert gas under a condition that a ratio of an oxygen radical density to an inert-gas radical density is equal to or lower than 5, after said etching.

2. The method as claimed in claim 1, further comprising:
    forming a metal film on said semiconductor substrate to fill said opening with a metal after said semiconductor device is left in atmosphere, said forming the metal film being performed after said performing ashing.

3. The method as claimed in claim 1, wherein said inert gas includes at least one of an argon gas, a helium gas, a nitrogen gas, and a hydrogen gas.

4. The method as claimed in claim 3, wherein said inert gas is an argon gas.

5. The method as claimed in claim 1, wherein
    said stacking includes further forming an antireflection film between said stopper film and said resist pattern,
    said etching includes etching said antireflection film with said F-containing etching gas, and
    said performing ashing includes performing ashing to remove said antireflection film, using said gas containing said oxygen gas and said inert gas under the condition that the ratio of the oxygen radical density to the inert-gas radical density is equal to or lower than 5 after said etching.

6. The method as claimed in claim 1, wherein said stopper film is a SiCN film.

7. The method as claimed in claim 1, wherein said etching gas is a $C_xF_y$ gas.

8. The method as claimed in claim 1, further comprising measuring said ratio of the oxygen radical density to the inert-gas radical density be means of optical emission analysis.

* * * * *